US010061199B2

(12) United States Patent
deVilliers

(10) Patent No.: US 10,061,199 B2
(45) Date of Patent: Aug. 28, 2018

(54) METHODS OF FORMING A MASK FOR SUBSTRATE PATTERNING

(71) Applicant: Tokyo Electron Limited, Minato-ku, Tokyo (JP)

(72) Inventor: Anton J. deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 116 days.

(21) Appl. No.: 15/188,449

(22) Filed: Jun. 21, 2016

(65) Prior Publication Data

US 2016/0377982 A1 Dec. 29, 2016

Related U.S. Application Data

(60) Provisional application No. 62/183,924, filed on Jun. 24, 2015.

(51) Int. Cl.
*G03F 7/40* (2006.01)
*G03F 7/20* (2006.01)

(52) U.S. Cl.
CPC .............. *G03F 7/40* (2013.01); *G03F 7/2024* (2013.01); *G03F 7/405* (2013.01)

(58) Field of Classification Search
CPC ..................... G03F 7/0035; G03F 7/2002
See application file for complete search history.

(56) References Cited

U.S. PATENT DOCUMENTS 6,338,934 B1 1/2002 Chen et al.
2009/0253081 A1* 10/2009 Abdallah ............ G03F 7/0035
430/324
2010/0323292 A1* 12/2010 Nakamura ............ G03F 7/0035
430/270.1
2013/0115559 A1 5/2013 Bae et al.
2013/0260311 A1 10/2013 Chang

FOREIGN PATENT DOCUMENTS

JP 2009-053657 3/2009
KR 10-2006-0007503 1/2006

OTHER PUBLICATIONS

International Patent Application No. PCT/US2016/038681, "International Search Report and Written Opinion," International Patent Application filed Jun. 22, 2016, International Search Report and Written Opinion dated Sep. 29, 2016.
Combined Taiwanese Office Action and Search Report dated Dec. 19, 2017 in Patent Application No. 105119666 (with English translation), 8 pages.

* cited by examiner

*Primary Examiner* — Kathleen Duda
(74) *Attorney, Agent, or Firm* — Oblon, McClelland, Maier & Neustadt, L.L.P.

(57) ABSTRACT

Patterning methods for creating features with sub-resolution dimensions that are self-aligned in photoresist materials. Techniques include selectably creating antispacers (or spacers) in soft materials, such as photoresist. A photoresist without a photo acid generator is deposited on a relief pattern of a solubility-neutralized photoresist material having a photo acid generator. A photomask then defines where photo acid is generated from a corresponding activating exposure. Photo acid is then diffused into the photoresist, that is free of the photo acid generator, to cause a solubility shift for subsequent development. These selectably-created antispacers can be line segments having widths defined by acid diffusion lengths, which can be widths of 1 nanometer to tens of nanometers. Moreover, the creation of antispacers, their location, and length, can be controlled using a photomask.

19 Claims, 5 Drawing Sheets

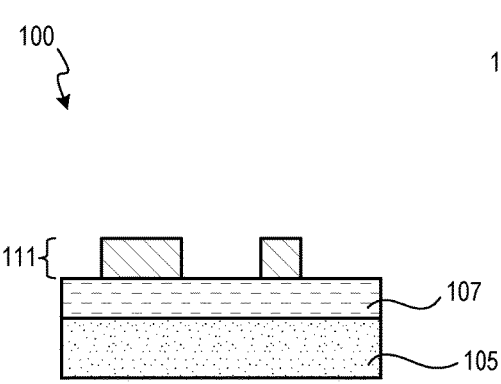
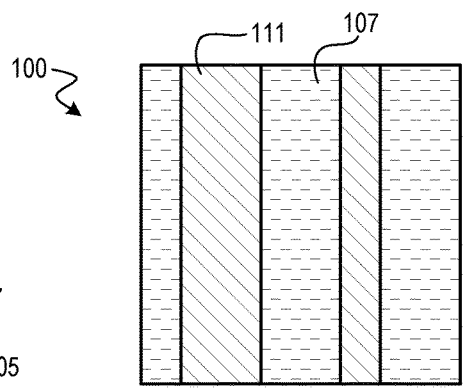
FIG. 1A  FIG. 1B
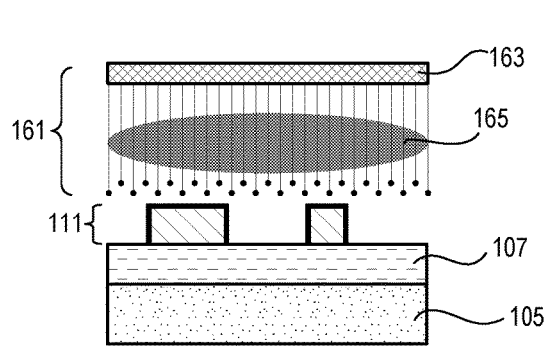
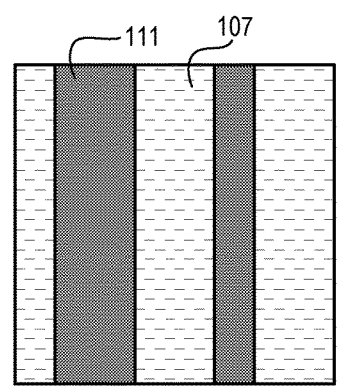
FIG. 2A  FIG. 2B
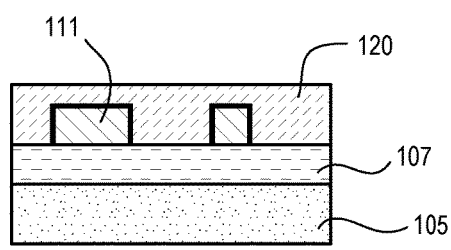
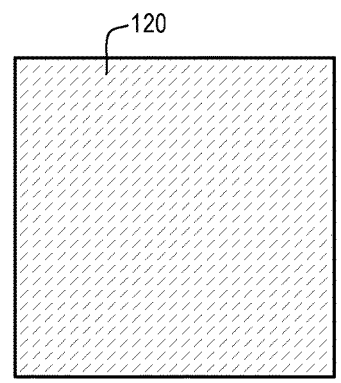
FIG. 3A  FIG. 3B

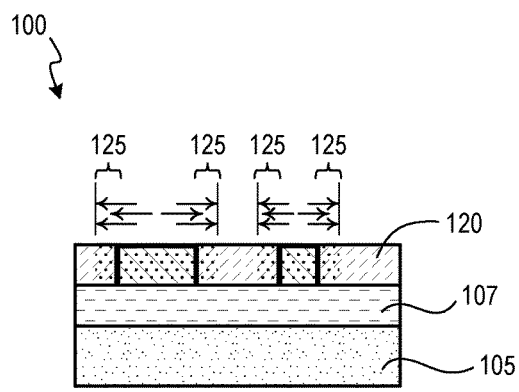
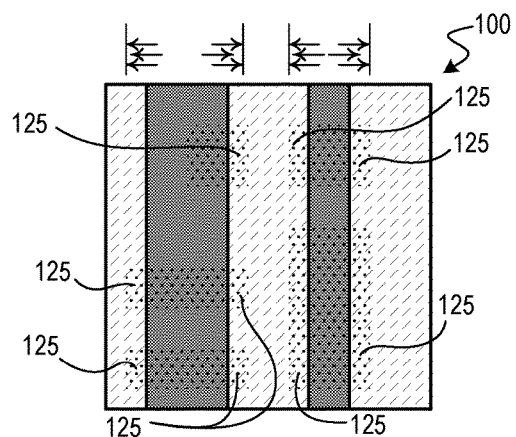
FIG. 7A    FIG. 7B
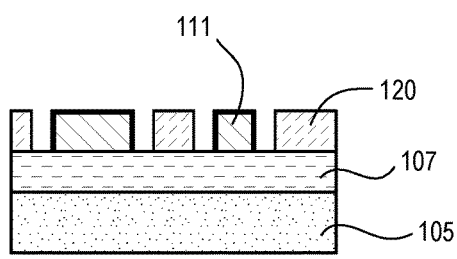
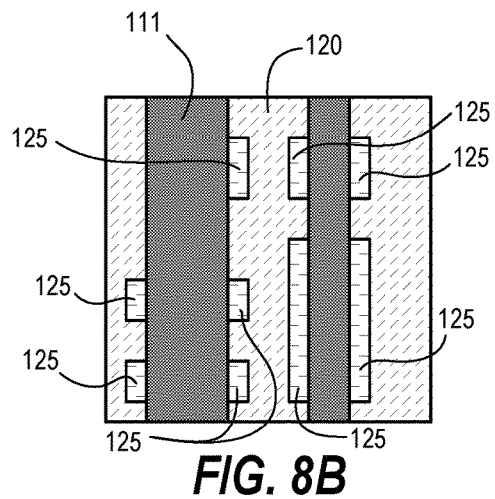
FIG. 8A    FIG. 8B
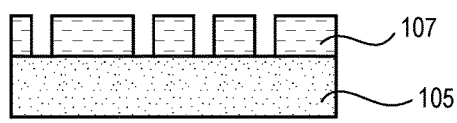
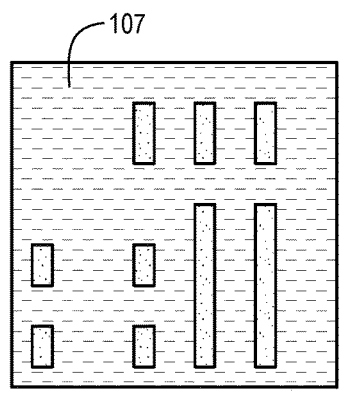
FIG. 9A    FIG. 9B

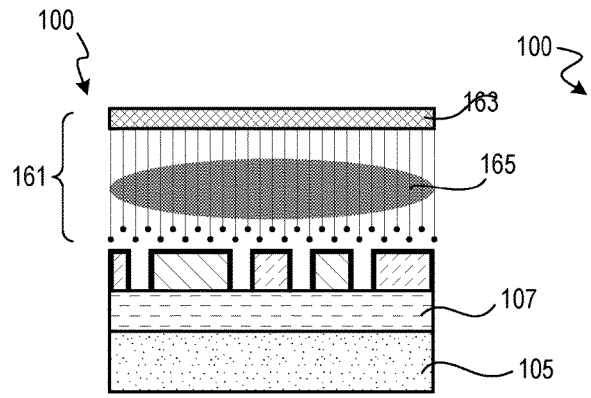 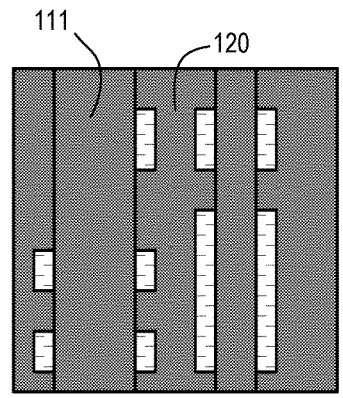
FIG. 10A              FIG. 10B
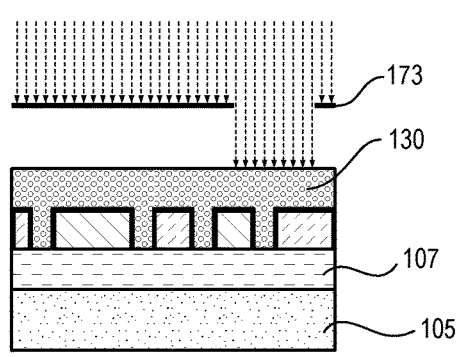 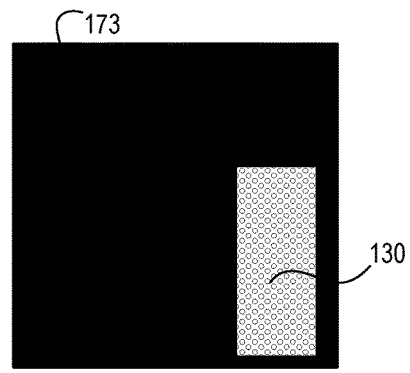
FIG. 11A              FIG. 11B
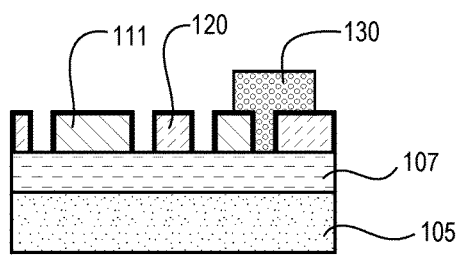 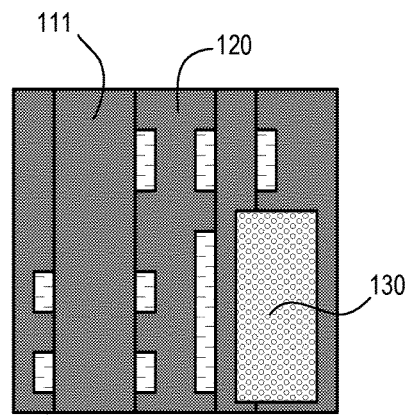
FIG. 12A              FIG. 12B

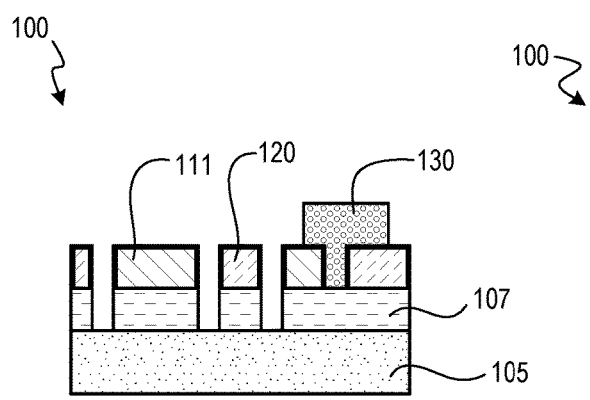
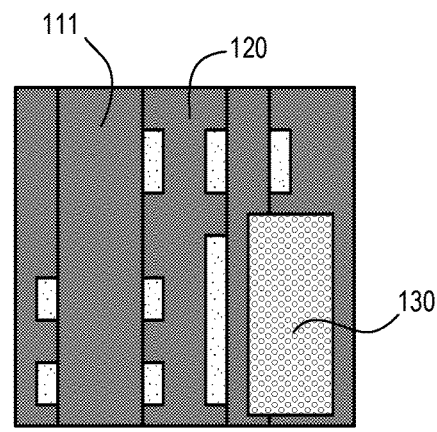
FIG. 13A  FIG. 13B
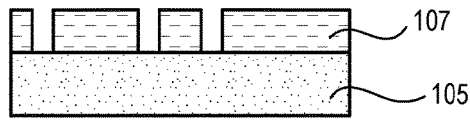
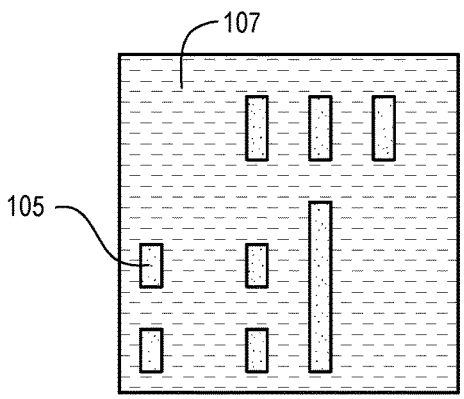
FIG. 14A  FIG. 14B

METHODS OF FORMING A MASK FOR SUBSTRATE PATTERNING

CROSS REFERENCE TO RELATED APPLICATIONS

The present application claims the benefit of U.S. Provisional Patent Application No. 62/183,924, filed on Jun. 24, 2015, entitled "Methods of Forming a Mask for Substrate Patterning," which is incorporated herein by reference in its entirety.

BACKGROUND OF THE INVENTION

This invention relates to microfabrication including microfabrication of integrated circuits as well as processes involved in patterning semiconductor substrates.

In material processing methodologies (such as photolithography), creating patterned layers typically involves the application of a thin layer of radiation-sensitive material, such as photoresist, to an upper surface of a substrate. This radiation-sensitive material is transformed into a patterned mask that can be used to etch or transfer a pattern into an underlying layer on a substrate. Patterning of the radiation-sensitive material generally involves exposure by a radiation source through a reticle (and associated optics) onto the radiation-sensitive material using, for example, a photolithographic exposure system. This exposure creates a latent pattern within the radiation-sensitive material which can then be developed. Developing refers to dissolving and removing a portion of the radiation-sensitive material to yield a relief pattern (topographic pattern). The portion of material removed can be either irradiated regions or non-irradiated regions of the radiation-sensitive material depending on a photoresist tone and/or type of developing solvent used. The relief pattern can then function as a mask layer defining a pattern.

Preparation and development of various films used for patterning can include thermal treatment or baking. For example, a newly applied film can receive a post-application bake (PAB) to evaporate solvents and/or to increase structural rigidity or etch resistance. Also, a post-exposure bake (PEB) can be executed to set a given pattern to prevent further dissolving. Fabrication tools for coating and developing substrates typically include one or more baking modules. Some photolithography processes include coating a substrate with a thin film of Bottom Anti-reflective Coating (BARC), followed by coating with a resist, and then exposing the substrate to a pattern of light as a process step for creating microchips. A relief pattern created can then be used as a mask or template for additional processing such as transferring the pattern into an underlying layer.

SUMMARY

Techniques herein include patterning methods for creating features with sub-resolution dimensions that are self-aligned in photoresist materials. Techniques include selectably creating antispacers in soft materials, such as photoresist. These selectably-created antispacers can be line segments having widths defined by acid diffusion lengths. Acid diffusion lengths can be widths of 1 nanometer to tens of nanometers. Moreover, the creation of antispacers, their location, and length, can be controlled using a photomask.

One embodiment includes a method of patterning a substrate. This method comprises receiving a substrate having a first relief pattern positioned on a target layer of the substrate. The first relief pattern includes one or more structures positioned on the target layer such that portions of the target layer are covered and remaining portions of the target layer are uncovered. The first relief pattern has been at least partially created using a first photomask. The first relief pattern is comprised of a first photoresist material that includes a generator compound that generates a solubility-changing agent in response to exposure to actinic radiation. A solubility-neutralizing treatment is executed that prevents a subsequent change in solubility of the first relief pattern from actinic radiation.

An overcoat material is deposited on the substrate. The overcoat material at least fills spaces defined by the one or more structures of the first relief pattern. The overcoat material is substantially free of the generator compound that generates the solubility-changing agent in response to exposure to actinic radiation. The substrate is transferred to a photolithographic system that exposes selected portions of the first relief pattern to actinic radiation using a second photomask. The actinic radiation causes the selected portions of the first relief pattern to generate the solubility-changing agent from the generator compound. The solubility-changing agent is caused to diffuse from the selected portions of the first relief pattern into the overcoat material at interfaces between the selected portions of first relief pattern and the overcoat material. The solubility-changing agent changes a solubility of portions of the overcoat material having received sufficient solubility-changing agent.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

FIGS. 1A-14A are cross-sectional schematic views of an example substrate segment showing a process flow according to embodiments disclosed herein.

FIGS. 1B-14B are schematic top views of an example substrate segment showing a process flow according to embodiments disclosed herein.

DETAILED DESCRIPTION

Figure 4A:
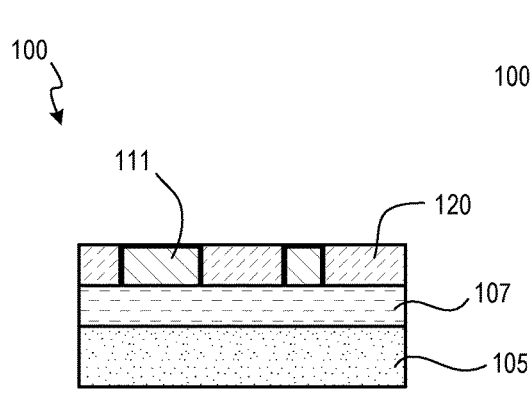

Techniques herein include patterning methods for creating features with sub-resolution dimensions that are self-aligned in photoresist materials. Techniques include selectably creating antispacers in soft materials, such as photoresist. These selectably-created antispacers can be line segments having widths defined by acid diffusion lengths, which can be widths of 1 nanometer to tens of nanometers. Moreover, the creation of antispacers, their location, and length, can be controlled using a photomask.

Example methods will now be described with reference to the figures. Note that figures ending with a letter "A" show cross-sectional side view illustrations of an example substrate segment, while correspondingly numbered figures ending with a letter "B" show a top view of the same example substrate segment. Referring now to FIGS. 1A-1B, one embodiment includes a method of patterning a substrate, such as a wafer for fabrication of semiconductor devices. In this method, a substrate 100 is received having a first relief pattern 111 positioned on a target layer 107 of the substrate 100. Target layer 107 can be positioned on one or more underlying layers 105. The first relief pattern 111 includes one or more structures positioned on the target layer such that portions of the target layer 107 are covered and remaining portions of the target layer 107 are uncovered. Note that first relief pattern 111 can be positioned directly on or indirectly on (over) the target layer 107. For example, there can be one or more intervening films (such as an anti-reflective coating film) between the target layer 107 and the first relief pattern 111. Thus, portions of the target layer 107 that are uncovered herein are uncovered in that there is no first relief pattern 111 vertically above these portions of target layer 107.

The first relief pattern 111 was at least partially created using a first photomask. The first relief pattern 111 can be comprised of a first photoresist material that includes a generator compound that generates a solubility-changing agent in response to exposure to actinic radiation. Various compounds can be selected for use as the solubility-changing agent. For example, a photo acid generator (PAG) that generates photo acid in response to exposure to actinic radiation can be used. In another example, a photo destructive base generator that generates photo destructive base in response to exposure to actinic radiation can be used. By way of a non-limiting example, first relief pattern 111 can include a mask layer of photoresist material that has been created by photolithographic (photomask-based) exposure (such as by using a scanner/stepper tool) followed by development, which can be accomplished by using a coater/developer tool. Optionally, a shrink operation can be executed that adjusts critical dimensions of the first relief pattern 111 prior to depositing subsequent materials.

After receiving or creating the first relief pattern 111 on substrate 100, a solubility-neutralizing treatment is executed that prevents a subsequent change in solubility of the first relief pattern 111 from actinic radiation. For example, first relief pattern 111 can be initially created by coating the substrate 100 with a photoresist layer, which includes a photo acid generator. The photo acid generator can be uniformly distributed within or on the photoresist layer. A portion of the photoresist layer is activated with light exposure and that portion (or the reverse portion) is removed. The remaining photoresist material, however, still contains the photo acid generator (not activated) and thus first relief pattern 111 could be subsequently made soluble if exposed to activating light. For methods herein, neutralizing or "freezing" this photoresist material is beneficial. After neutralizing the first relief pattern 111 from subsequent solubility shifts, the first relief pattern 111 will not become dissolved when in contact with a corresponding solvent, such as a solvent used to create the first relief pattern 111.

Various different solubility-neutralizing treatments (also known as freezes) can be optionally selected. One example freeze treatment is that of treating the first relief pattern with a flux of ballistic electrons. This can be accomplished in a plasma processing chamber by coupling negative direct current power to an upper electrode of the plasma processing chamber. This freeze technique is sometimes known as direct current superposition. FIGS. 2A-2B show a freeze that uses direct current superposition. Negative polarity direct current power is coupled to an upper electrode 163 of a plasma processing system. A flux of electrons 161 is accelerated from the upper electrode 163 with sufficient energy to pass through plasma 165 and strike the substrate 100 such that an exposed surface of the first relief pattern 111 changes in physical properties including becoming unresponsive to solubility shifts. Cross-linking can occur within such treated material. Additionally, a conformal film can be created/deposited on the first relief pattern 111. A thickness of this film can be controlled to be less than a diffusion-blocking thickness such that the conformal film permits diffusion of the solubility-changing agent. In other words, despite a film encasing the first relief pattern 111, photo acid is still capable of diffusing out of the first relief pattern 111. Other photoresist freeze treatments can be alternatively used. Other freezes can include, but are not limited to, thermal freeze, cross-link freeze, gaseous freeze, implant freeze, atomic layer deposition (ALD) freeze (that is sufficiently thin for diffusion), or an ALD freeze that has a ligand group with an acid attached.

Referring now to FIGS. 3A-3B, an overcoat material 120 is deposited on the substrate 100. The overcoat material at least fills spaces defined by the one or more structures of the first relief pattern 111. In practice, with spin-on overcoat materials, the overcoat material will not only fill spaces but will typically entirely cover the one or more structures. The overcoat material 120 is free of the generator compound that generates the solubility-changing agent in response to exposure to actinic radiation. Note that being free of the generator compound means being substantially free or effectively free in that there is either no generator compound or there is an insufficient amount of the generator compound to generate sufficient solubility-changing agent to cause the overcoat material to become soluble, even with a flood expose. The overcoat material, nevertheless, includes a deprotection group. This deprotection group can cause the overcoat material 120 to become soluble in the presence of photo acid. For example, the overcoat material can be a conventional photoresist without a PAG. Alternatively, the overcoat material can be a polymer material that includes a deprotection group or agent to become soluble in the presence of a photo acid or photo base.

The overcoat material 120 includes a deprotection group that reacts to the presence of a solubility-changing agent by changing the solubility of the overcoat material. In other words, the overcoat material is capable of having a solubility switch in the presence of photo acid, yet lacks a photo acid generator. The overcoat material can include other properties of conventional photoresists such as the ability to be chemically amplified, include a resin, have base loading with the expectation of having an acid diffusion front, ability to resist certain plasma etching processes, etc. In other words, the overcoat maintains functionality of conventional photoresist materials except that the overcoat material lacks a photo acid generator or photo destructive base generator.

Thus, any actinic radiation exposure directly to this overcoat material would not cause a solubility change by itself.

Figure 4B:
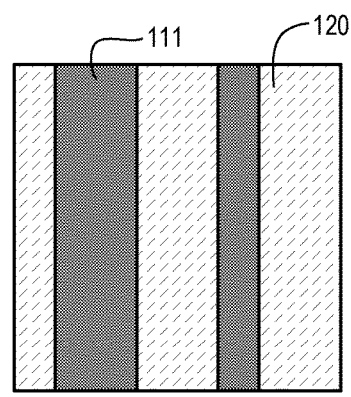

In many embodiments, depositing the overcoat material 120 can result is an overburden on the first relief pattern 111. This can be a function of a type of deposition and/or type of material deposited. Photoresists are routinely deposited via spin-on deposition, which can result in an overburden. Depending on the specifics of a particular deposition operation, the overburden can be minimal or relatively thick. In embodiments in which the overburden is relatively thick, or thicker than an average diffusion length of a particular photo acid, an overburden removal process can be executed. The overburden removal process can include a wet etch-back, a controlled vertical acid diffusion step, and/or using a residual minimum develop rate of a particular material selected for use as the overcoat. Such overburden removal can be beneficial in embodiments where the overburden is comparatively thick. In embodiments in which the overburden is relatively thin, the overburden removal step can be omitted and is typically not needed because acid diffusion also occurs vertically upward in addition to diffusing horizontally as described below. Any included wet etch-back or wet-develop step can be executed after actinic radiation exposure. FIGS. 3A-3B show substrate 100 having an overburden of overcoat material 120, and FIGS. 4A-4B show this overburden having been removed so that top surfaces of the first relief pattern 111 are now uncovered.

Figure 5A:
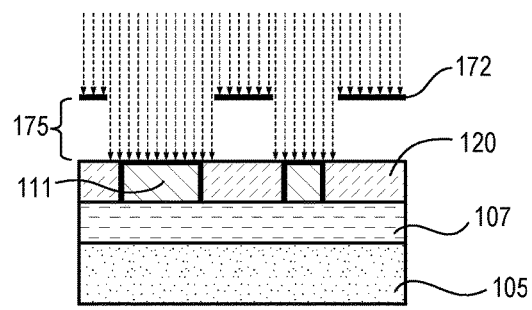
Figure 5B:
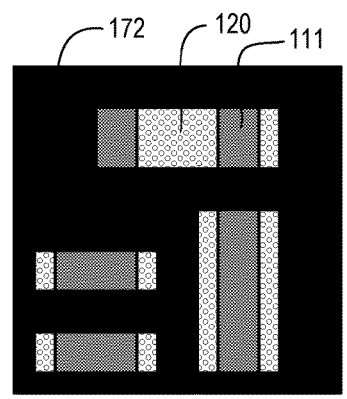
Figure 6A:
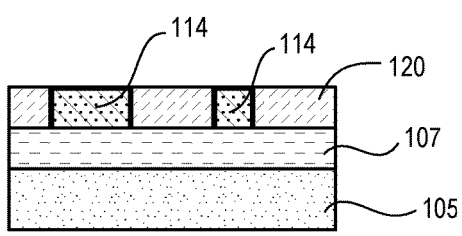
Figure 6B:
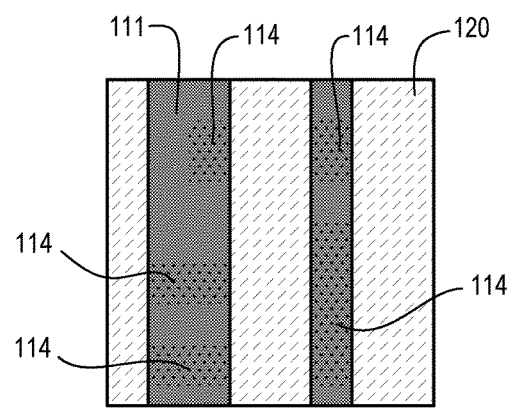

Referring now to FIGS. 5A-5B, the substrate 100 can then be transferred to a photolithographic system that exposes selected portions of the first relief pattern 111 to actinic radiation using a second photomask 172. The actinic radiation causes the selected portions of the first relief pattern 111 to generate the solubility-changing agent from the generator compound. Note that in some embodiments, the second photomask 172 is used to delineate the selected portions of first relief pattern 111 that receive activating radiation 175. As can be seen in FIG. 5B, second photomask 172 defines openings through which the first relief pattern 111 is visible. Note that a given photomask pattern can extend into regions of the overcoat material 120, which is acceptable because exposure of the overcoat material 120 does not cause generation of a solubility-changing agent within the overcoat material 120 itself. The exposure, however, causes the generator compound within first relief pattern 111 to generate the solubility-changing agent, which is represented in regions 114 of FIGS. 6A-6B. Thus, protection against overlay error is accordingly provided.

The solubility-changing agent (having been generated within first relief pattern 111) is now caused to diffuse from the selected portions of the first relief pattern 111 into the overcoat material 120 at interfaces between the selected portions of first relief pattern 111 and the overcoat material 120. The solubility-changing agent changes a solubility of portions of the overcoat material having received sufficient solubility-changing agent. For example, with a sufficient concentration of photo acid diffused into overcoat material 120, a deprotection reaction can occur changing a solubility of corresponding regions. In FIGS. 7A-7B, regions 125 demarcate locations of overcoat material 120 within which a deprotection reaction has occurred, or has otherwise shifted a solubility. For example, changing a solubility of portions of the overcoat material 120 having received the solubility-changing agent can include the portions of the overcoat material having received the solubility-changing agent becoming soluble in the presence of photo acid, or insoluble in the presence of a photo destructive base.

Causing or activating diffusion can be executed by supplying an activating energy. For example, by applying heat to the substrate (from above and/or below). Activating diffusion can also include causing the solubility-changing agent to diffuse into the overcoat material by controlling an average diffusion length into the overcoat material. Thermally activating diffusion can include heating the substrate at a predetermined temperature and for a predetermined duration. Selection of PAG materials as well as time and temperature controls can be used to accurately diffuse photo acid to a desired length.

The now soluble (or insoluble) portions of overcoat material 120 (regions 125) can be removed by a developing step. For example, even though overcoat material 120 did not have any generator compound, overcoat material 120 was nevertheless comprised of a deprotection group which caused a solubility shift in the presence of acid having been diffused into select regions of overcoat material 120. The select regions can then be removed (or kept) thereby creating antispacer segments or spacer segments within a layer of photoresist. These antispacer segments are self-aligned (diffusion occurring at material interfaces) to an existing/created pattern, and have a precisely controllable width being based on acid diffusion lengths, and have a placement and antispacer length that is photo-selectable in that a photomask defines locations in which antispacer segments are created within a layer of photoresist. FIGS. 8A-8B show a result of having removed overcoat material 120 from regions 125. These regions can be contact openings, slot contacts, etc. The result is a combined relief pattern. This combined relief pattern combines first relief pattern 111, as well as overcoat material 120 (now having a relief pattern).

As should be appreciated by those skilled in the art, any number of additional fabrication and patterning extension processes can be executed. For example, this first combined pattern, defined by both the first relief pattern and the overcoat material, can be transferred into the target layer 107. FIGS. 9A-9B show a representative result of such a pattern transfer, which can be executed using a plasma-based etch process, which typically uses directional etchants.

In the preceding method, one of multiple available freeze treatments was used to neutralize a solubility of the first relief pattern 111. In an alternative embodiment, specific solvent and material selections can be used to provide the same result, but without executing a separate freeze step. By way of a non-limiting example, a negative tone developer compatible solvent can be selected for use in developing the antispacer segments. In this embodiment, the overcoat material is configured to react with photo acid (or a base) to be developable using negative tone developer. Such an overcoat material can be deposited on the first relief pattern 111 without the first relief pattern having been neutralized to solubility shifts. Such an overcoat does not behave as a conventional resist and can thus be selected to become soluble to a negative tone developer after being in the presence of photo acid or a base. With the first relief pattern selected to be insoluble to a negative tone developer, the first relief pattern remains and only the antispacer segments are developed or removed. In other words, typically a negative tone developer will dissolve dark portions (unexposed) portions of a positive tone resist, but deprotection groups and photo reactive agents can be included so that the antispacer segments appear as protected regions (as then soluble) to a negative tone developer.

In another embodiment, a portion of the first combined pattern, defined by both the first relief pattern and the overcoat material, is transferred into the target layer by using a keep mask or a defeat mask. Using a keep mask or defeat mask can be beneficial in patterning applications in which there are conflicts (elevational) with the placement of some features. There are various process steps that can be used to accomplish a partial pattern transfer. One option is to use a memorization layer, which is typically a hard material, as a temporary or sacrificial pattern transfer layer. With the first combined pattern memorized within a hard material, a second photoresist layer can be deposited, exposed, and developed. The resulting relief pattern can then function to define what features of the combined pattern to keep (transfer through to the target layer) or exclude (leave covered to prevent feature transfer).

Another option for partial transfer is to freeze the overcoat material, thereby freezing both photoresist materials. For example, as shown in FIGS. 10A-10B, an electron flux can be used to cross-link and encase the overcoat material 120. Such a plasma processing treatment is described above. After freezing the overcoat material, additional photolithographic patterning can be executed. For example, a third photomask 173 can be used to create a keep mask or defeat mask in second photoresist material 130, as shown in FIGS. 11A-11B. FIGS. 12A-12B show a result of patterning the second photoresist material 130 after exposure and development. Note that a region of second photoresist material 130 remains on substrate 100 and thus functions to mask one opening of the combined pattern in this particular example. An etch transfer can then be executed that transfers unblocked openings of the combined pattern into target layer 107. A result of such partial pattern transfer is shown in FIGS. 13A-13B. The layers of photoresist can then be removed leaving a patterned target layer having selected sub-resolution contacts, as represented in FIGS. 14A-14B.

Another method for patterning a substrate includes receiving a substrate having a first relief pattern positioned on a target layer of the substrate. The first relief pattern includes one or more structures positioned on the target layer such that portions of the target layer are covered and remaining portions of the target layer are uncovered. The first relief pattern has been at least partially created using a first photomask. The first relief pattern is comprised of a first polymer material that includes a generator compound that generates a solubility-changing agent in response to exposure to actinic radiation.

A solubility-neutralizing treatment is executed that prevents a subsequent change in solubility of the first relief pattern from actinic radiation. A second polymer material is deposited on the substrate. The second polymer material at least fills spaces defined by the one or more structures of the first relief pattern. The second polymer material is substantially free of the generator compound that generates the solubility-changing agent in response to exposure to actinic radiation. In other words, there is no included generator compound—or there is insufficient generator compound—to create sufficient photo acid to cause a solubility shift in the second polymer material.

Selected portions of the first relief pattern are exposed to actinic radiation using a second photomask. The actinic radiation causes the selected portions of the first relief pattern to generate the solubility-changing agent from the generator compound. The solubility-changing agent is then caused to diffuse from the selected portions of the first relief pattern into the second polymer material at interfaces between the selected portions of first relief pattern and the second polymer material. The solubility-changing agent changes a solubility of portions of the second polymer material having received sufficient solubility-changing agent.

Accordingly, such methods enable creating sub-resolution, self-aligned features on mandrels of various sizes, spacing, lengths, and locations, all within wet chemistry materials. Widths of antispacers and spacers are thus controlled by average molecular diffusion lengths of photo acid in contrast to being controlled by photo mask dimensions. Combined with a photoresist without a PAG, a second photomask essentially demarcates the locations in which antispacers are to be formed, thereby providing an antispacer creation mask. By comparison, conventional antispacer creation involves a flood exposure which creates antispacers around all mandrels. With antispacers created on all interfaces, several additional steps are needed to functionalize these antispacers including steps of cutting antispacers, double patterning, memorizing, re-planarizing, and re-exposing. Techniques herein, however, can be used to create antispacers on demand. Techniques herein can thus provide a true in situ double patterning process in that an intervening etch transfer is not required.

With antispacer generation mandrels left initially dormant, antispacers are then selectively created by a second photomask (exposure). If this second exposure radiates on a particular portion of the first relief pattern, then in response to that second exposure, the particular portion exposed generates acid which diffuses out of the first relief pattern, and then antispacer segments are formed on the edges of the first relief pattern receiving actinic radiation. Any extended photolithographic exposure that extends into the overcoat is acceptable because the overcoat does not have a photo acid generator to be activated by the exposure. This scheme thus provides some inherent overlay protection for a photo exposure.

Note that it should be appreciated that various selections of materials and exposures are contemplated herein. For example, particular PAGs can be selected for their diffusion length capabilities. Wavelengths of activating light can be mixed and combined. For example, the initial exposure to create the first relief pattern can be executed using 248 nm light, while the second photo mask can be exposed using 193 nm light or 13.5 nm light or another desired wavelength. Thus, one dimension is defined by acid diffusion, while another dimension can be defined by optical resolution. In some embodiments, positive tone resist can be used for the first and second resist layers using positive tone developer compatible resist, while in a second photoresist layer, a negative tone developer compatible photoresist can be used.

In some embodiments, a photo destructive base (PDB) generator can be used instead of a PAG. Using a PDB can yield a partially reversed result. For example, regions 125 from FIG. 7B become insoluble such that the remainder of overcoat material 120 is removed during a developing step. In this particular example, spacers would be created instead of antispacers. In other words, using a PDB can result in adding more material to first relief pattern 111. Thus, there are many patterning options for using methods herein.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of patterning a substrate, the method comprising:
    receiving a substrate having a first relief pattern positioned on a target layer of the substrate, the first relief pattern including one or more structures positioned on the target layer such that portions of the target layer are covered and remaining portions of the target layer are uncovered, the first relief pattern having been at least partially created using a first photomask, the first relief pattern comprised of a first photoresist material that includes a generator compound that generates a solubility-changing agent in response to exposure to actinic radiation;
    executing a solubility-neutralizing treatment that prevents a subsequent change in solubility of the first relief pattern from actinic radiation;
    depositing an overcoat material on the substrate, the overcoat material at least filling spaces defined by the one or more structures of the first relief pattern, the overcoat material being free of the generator compound that generates the solubility-changing agent in response to exposure to actinic radiation;
    transferring the substrate to a photolithographic system;
    exposing, by the photolithographic system, selected portions of the first relief pattern to actinic radiation using a second photomask, the actinic radiation causing the selected portions of the first relief pattern to generate the solubility-changing agent from the generator compound; and
    diffusing the solubility-changing agent from the selected portions of the first relief pattern into the overcoat material at interfaces between the selected portions of first relief pattern and the overcoat material, the solubility-changing agent changing a solubility of portions of the overcoat material having received sufficient solubility-changing agent.

2. The method of claim 1, further comprising
    removing soluble portions of the overcoat material subsequent to diffusion of the solubility-changing agent.

3. The method of claim 2, further comprising:
    transferring a first combined pattern defined by both the first relief pattern and the overcoat material into the target layer.

4. The method of claim 2, further comprising
    transferring a portion of a first combined pattern, defined by both the first relief pattern and the overcoat material, into the target layer by using a keep mask or a defeat mask.

5. The method of claim 1, wherein changing a solubility of portions of the overcoat material having received the solubility-changing agent includes the portions of the overcoat material having received the solubility-changing agent becoming soluble in the presence of photo acid.

6. The method of claim 1, wherein changing a solubility of portions of the overcoat material having received the solubility-changing agent includes the portions of the overcoat material having received the solubility-changing agent becoming insoluble in the presence of photo destructive base.

7. The method of claim 1, wherein diffusing the solubility-changing agent into the overcoat material includes thermally activating diffusion.

8. The method of claim 7, wherein diffusing the solubility-changing agent into the overcoat material includes controlling an average diffusion distance into the overcoat material.

9. The method of claim 8, wherein thermally activating diffusion includes heating the substrate at a predetermined temperature and for a predetermined duration.

10. The method of claim 1, wherein executing the solubility-neutralizing treatment includes treating the first relief pattern with a flux of ballistic electrons.

11. The method of claim 1, wherein executing the solubility-neutralizing treatment includes creating a conformal film on the first relief pattern having a thickness less than a diffusion-blocking thickness such that the conformal film permits diffusion of the solubility-changing agent.

12. The method of claim 1, wherein executing the solubility-neutralizing treatment includes executing a photoresist freeze treatment.

13. The method of claim 1, wherein the overcoat material includes a deprotection group that causes the overcoat material to become soluble in the presence of photo acid.

14. The method of claim 1, wherein depositing the overcoat material results in an overburden on the first relief pattern.

15. The method of claim 1, wherein the generator compound is a photo acid generator (PAG) that generates photo acid in response to exposure to actinic radiation.

16. The method of claim 1, wherein the generator compound is a photo destructive base generator that generates photo destructive base in response to exposure to actinic radiation.

17. The method of claim 1, further comprising:
    prior to transferring the substrate to the photolithographic system, executing an overburden removal process that removes a vertical portion of the overcoat material resulting in top surfaces of the first relief pattern being uncovered.

18. The method of claim 1, further comprising:

executing a shrink operation that adjusts critical dimensions of the first relief pattern prior to depositing the overcoat material.

19. A method of patterning a substrate, the method comprising:

receiving a substrate having a first relief pattern positioned on a target layer of the substrate, the first relief pattern including one or more structures positioned on the target layer such that portions of the target layer are covered and remaining portions of the target layer are uncovered, the first relief pattern having been at least partially created using a first photomask, the first relief pattern comprised of a first polymer material that includes a generator compound that generates a solubility-changing agent in response to exposure to actinic radiation;

executing a solubility-neutralizing treatment that prevents a subsequent change in solubility of the first relief pattern from actinic radiation;

depositing second polymer material on the substrate, the second polymer material at least filling spaces defined by the one or more structures of the first relief pattern, the second polymer material being free of the generator compound that generates the solubility-changing agent in response to exposure to actinic radiation;

exposing selected portions of the first relief pattern to actinic radiation using a second photomask, the actinic radiation causing the selected portions of the first relief pattern to generate the solubility-changing agent from the generator compound; and diffusing the solubility-changing agent from the selected portions of the first relief pattern into the second polymer material at interfaces between the selected portions of first relief pattern and the second polymer material, the solubility-changing agent changing a solubility of portions of the second polymer material having received sufficient solubility-changing agent.

\* \* \* \* \*

UNITED STATES PATENT AND TRADEMARK OFFICE
CERTIFICATE OF CORRECTION

PATENT NO. : 10,061,199 B2  
APPLICATION NO. : 15/188449  
DATED : August 28, 2018  
INVENTOR(S) : Anton J. deVilliers Page 1 of 1

It is certified that error appears in the above-identified patent and that said Letters Patent is hereby corrected as shown below:

In the Claims

Column 10, Line 8, Claim 2, "comprising" should be --comprising:--;

Column 10, Line 16, Claim 4, "comprising" should be --comprising:--; and

Column 12, Line 4, Claim 19, "depositing" should be --depositing a--.

Signed and Sealed this  
Twenty-first Day of April, 2020

Andrei Iancu  
*Director of the United States Patent and Trademark Office*